(12) United States Patent
Chang

(10) Patent No.: US 8,685,860 B2
(45) Date of Patent: Apr. 1, 2014

(54) SEMICONDUCTOR STRUCTURE AND MANUFACTURING METHOD THEREOF

(71) Applicant: Ineffable Cellular Limited Liability Company, Wilmington, DE (US)

(72) Inventor: Wen-Hsiung Chang, Hsinchu (TW)

(73) Assignee: Ineffable Cellular Limited Liability Company, Wilmington, DE (US)

( * ) Notice: Subject to any disclaimer, the term of this patent is extended or adjusted under 35 U.S.C. 154(b) by 0 days.

(21) Appl. No.: 13/655,374

(22) Filed: Oct. 18, 2012

(65) Prior Publication Data

US 2013/0113100 A1 May 9, 2013

Related U.S. Application Data

(63) Continuation of application No. 12/775,114, filed on May 6, 2010, now Pat. No. 8,293,640.

(51) Int. Cl.
*H01L 21/311* (2006.01)

(52) U.S. Cl.
USPC ........... 438/700; 438/118; 438/463; 438/637; 438/712; 257/E21.006; 257/E21.134; 257/E21.218; 257/E21.288

(58) Field of Classification Search
USPC ......... 438/106, 118, 119, 463, 637, 700, 687, 438/688, 712; 257/E21.006, E21.134, 257/E21.218, E21.288
See application file for complete search history.

(56) References Cited

U.S. PATENT DOCUMENTS

| 7,972,902 | B2 * | 7/2011 | Youn et al. ..................... 438/107 |
| 8,293,640 | B2 * | 10/2012 | Chang ........................... 438/118 |
| 2010/0001939 | A1 | 1/2010 | Ochiai et al. | |
| 2010/0225347 | A1 | 9/2010 | Worley et al. | |
| 2011/0278739 | A1 | 11/2011 | Lai et al. | |

FOREIGN PATENT DOCUMENTS

TW    200841452 A    10/2008

OTHER PUBLICATIONS

Non-Final Office Action on U.S. Appl. No. 12/775,114, mailed Dec. 9, 2011.
Notice of Allowance on U.S. Appl. No. 12/775,114, mailed Apr. 27, 2012.

* cited by examiner

*Primary Examiner* — David Nhu

(57) ABSTRACT

A semiconductor structure and a manufacturing method thereof are provided. The method includes the following steps. Firstly, a semiconductor substrate having an active surface and a back surface is provided. The active surface is opposite to the back surface, and the semiconductor substrate includes at least one grounding pad disposed on the active surface. Secondly, at least one through silicon via is formed through the semiconductor substrate from the back surface to the active surface thus exposing the grounding pad. Then, a conductive layer is formed on the back surface of the semiconductor substrate and filled into the through silicon via to electrically connect to the grounding pad and the semiconductor substrate.

18 Claims, 4 Drawing Sheets

US 8,685,860 B2

SEMICONDUCTOR STRUCTURE AND MANUFACTURING METHOD THEREOF

RELATED APPLICATIONS

This application is a continuous application of U.S. patent application Ser. No. 12/775,114, filed on May 6, 2010, and the entire contents of which are incorporated herein by reference.

BACKGROUND

1. Field

The present application relates to a semiconductor structure and a manufacturing method thereof, and more particularly to a semiconductor structure with uniformly grounded electricity and a manufacturing method thereof.

2. Description of the Related Art

In traditional packaging technique of semiconductor, grounding pads disposed on a chip are electrically connected to external grounding device by wire bonding process. Further, each grounding pad has to connect with many wires for transmitting high power current in high power chip and high frequency chip.

However, since the amount of the wires which are allowed to connect to a single grounding pad is limited by the area of each grounding pad, the layout of the wires becomes more difficult as the size of recent semiconductor device is reduced. Additionally, because the distances between each grounding pad and the external grounding device are different, the lengths of the used wires are also different. If the length of the wires is over long, the electricity may be decayed and the electricity of the grounding pad and the external grounding device may not be matched to each other.

Therefore, how to reduce the transmittance distance of the grounding signal of the chip, is an important problem.

BRIEF SUMMARY

Accordingly, an embodiment is directed to a manufacturing method of a semiconductor structure to improve the grounding signal transmission quality.

Another embodiment is also directed to a semiconductor structure with uniform grounded character and improved operating efficiency.

An embodiment provides a manufacturing method of a semiconductor structure including the following steps. First, a semiconductor substrate having an active surface and a back surface and including at least one grounding pad disposed on the active surface is provided. Next, at least one through silicon via is formed through the semiconductor substrate from the back surface to the active surface and thus exposing the grounding pad. Then, a conductive layer is formed on the back surface of the semiconductor substrate and filled into the through silicon via to electrically connect to the grounding pad and the semiconductor substrate.

In one embodiment, before forming the through silicon via, the method for manufacturing semiconductor structure further includes the step of adhering the active surface of the semiconductor substrate to a carrier substrate. Furthermore, after forming the conductive layer, the semiconductor substrate is separated from the carrier substrate.

In one embodiment, the semiconductor substrate includes at least one power supply/signal pad disposed on the active surface. In addition, after separating the semiconductor substrate from the carrier substrate, a wire bonding is further performed on the active surface of the semiconductor substrate to electrically connect the power supply/signal pad and external circuits.

An embodiment also provides a semiconductor structure including a semiconductor substrate and a conductive layer, wherein the semiconductor substrate has an active surface and a back surface. The active surface is opposite to the back surface, and the semiconductor substrate includes at least one grounding pad disposed on the active surface. In addition, there is at least one through silicon via through the semiconductor substrate from the back surface to the active surface and thus exposing the grounding pad. The conductive layer is disposed on the back surface of the semiconductor substrate and filled into the through silicon via to electrically connect to the grounding pad and the semiconductor substrate.

In one embodiment, the semiconductor substrate further includes at least one power supply/signal pad disposed on the active surface.

In one embodiment, the power supply/signal pad is disposed closer to the edge of the semiconductor substrate compared to the grounding pad.

In one embodiment, the conductive layer is made of, for example, copper or aluminum.

In another embodiment, at least one through silicon via is formed on the semiconductor substrate and exposing the grounding pad. Then, a conductive layer is formed on the back surface of the semiconductor substrate and filled into the through silicon via to electrically connect to the grounding pad. In other words, the present invention uses TSV (Through-Silicon Via) technology to fabricate the transmission path of ground signal. Compared to the conventional wire bonding art, the present invention increases the transmission density of ground signal per unit area.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1A:
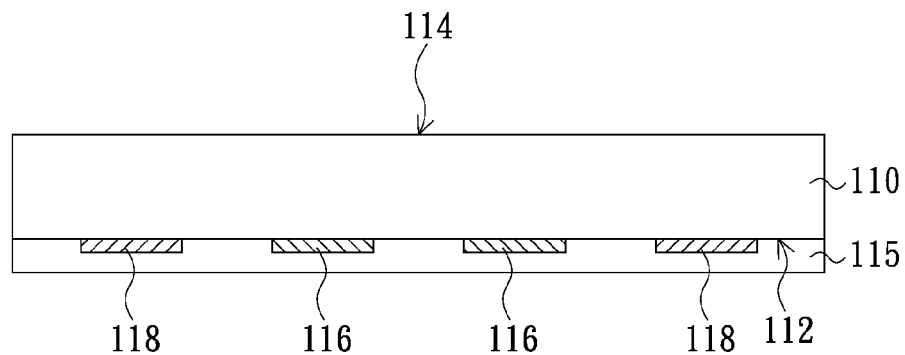
FIGS. 1A to 1E are cross-sectional schematic views of a manufacturing process of a semiconductor structure according to an embodiment of the present invention.

FIGS. 1A to 1E are cross-sectional schematic views of a manufacturing process of a semiconductor structure according to an embodiment. Referring to FIG. 1A, a semiconductor substrate 110 having an active surface 112 and a back surface 114 is provided, and the active surface 112 is opposite to the back surface 114. In this embodiment, the semiconductor substrate 110 is, for example, a wafer, but the present invention is not limited hereto. In other embodiments, the semiconductor substrate 110 may be diced from a wafer. Furthermore, the semiconductor substrate 110 includes at least one grounding pad 116 disposed on the active surface 112. Specifically, a plurality of material layers 115 are formed on the active surface 112 of the semiconductor substrate 110, and the ground pad 116 may be disposed in any material layer. In order to describe conveniently, FIG. 1A only shows a single material layer 115 and plurality of ground pads 116 therein. In the embodiment, the semiconductor substrate 110 further includes at least one power supply/signal pad 118 disposed on the active surface 112 the same as the ground pads 116.

Since the power supply/signal pads 118 are electrically connected to an external circuit by a wire bonding process, the power supply/signal pads 118 of this embodiment are disposed closer to the edges of the semiconductor substrate 110 compared to the grounding pads 116. Thus, it is convenient to perform the wire bonding process of the power supply/signal pads 118.

Figure 1B:
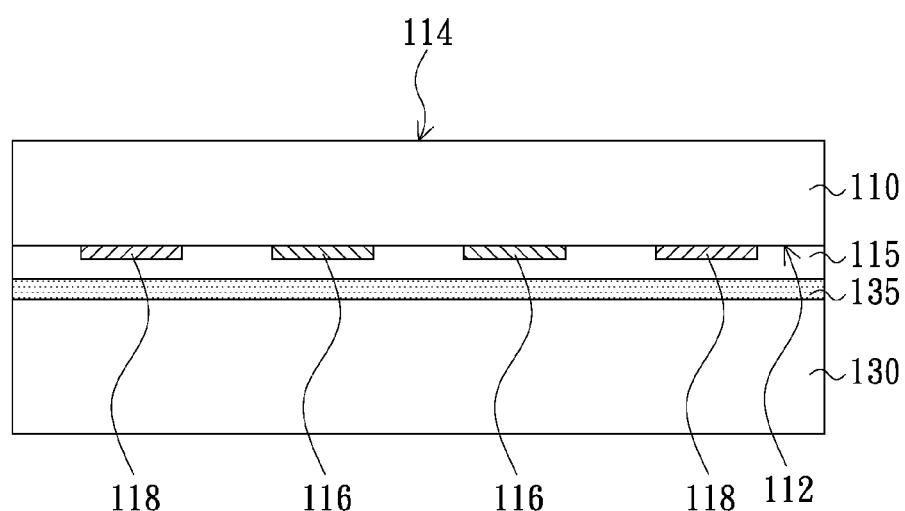

Referring to FIG. 1B, the semiconductor substrate 110 is adhered to the carrier substrate 130 in the present embodiment to prevent the semiconductor substrate 110 from damage caused by insufficient rigidity in the subsequent process. For example, the semiconductor substrate can be adhered to the carrier substrate 130 through an adhering layer 135, and the active surface 112 is contacted with the adhering layer 135. Moreover the adhering layer 135 can be an adhering layer having a temporary adhesive effect, such as ultraviolet adhesive, hot melt adhesive or dissolvable adhesive that may be dissolved by a solvent, but the invention is not limited hereto. Furthermore, the carrier substrate 130 is, for example, a transparent plastic substrate.

Figure 2:
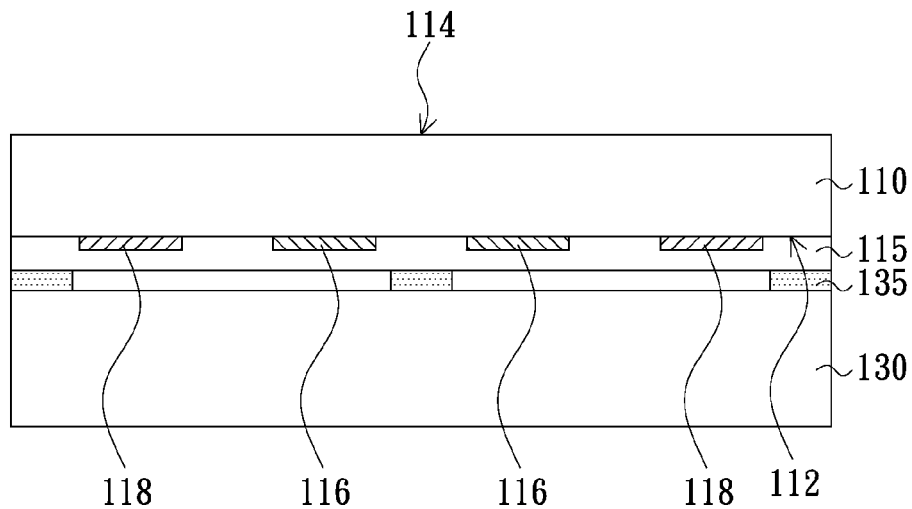
FIG. 2 is a cross-sectional schematic view of a part of a manufacturing process of a semiconductor structure according to another embodiment of the present invention.

It should be noted that, in the embodiment, the adhering layer 135 spreads between the carrier substrate 130 and the semiconductor substrate 110 completely. However, in other embodiments, the adhering layer 135 may be patterned to distribute between the carrier substrate 130 and the semiconductor substrate 110, as shown in FIG. 2. As such, the adhering layer 135 may not be in contact with the semiconductor elements (not shown) on the active surface 122 of the semiconductor substrate 110, and thus, the semiconductor elements can be prevented from damage caused by removing the adhering layer 135.

Figure 1C:
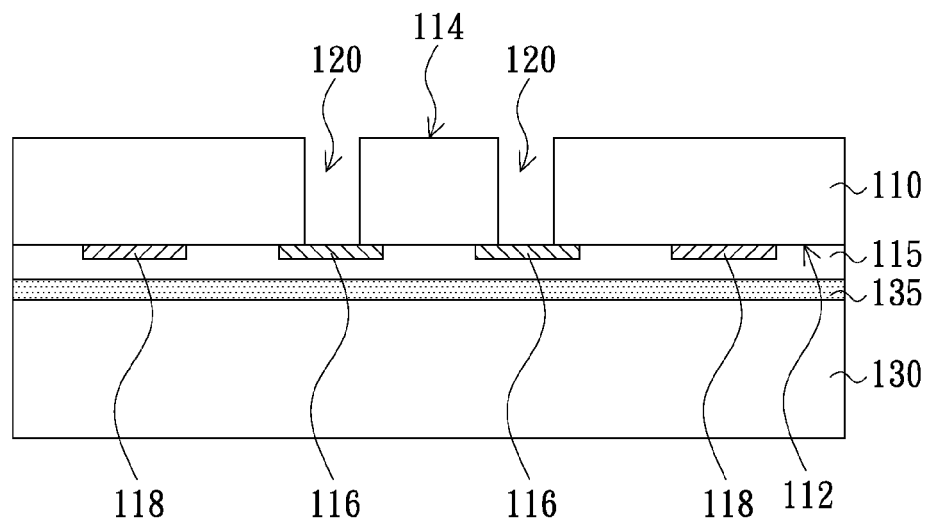

Referring to FIG. 1C, at least one through silicon via 120 is formed in the semiconductor substrate 110, so as to expose the grounding pad 116. Specifically, the amount of the through silicon vias 120 is equal to the amount of the grounding pads 116. Therefore, all grounding pads 116 disposed on the active surface 112 can be exposed by the through silicon vias 120. The through silicon vias 120 can be formed from the back surface 114 through to the active surface 112 by laser drilling or deep reactive ion etching (DRIE), but the invention is not limited hereto.

Figure 1D:
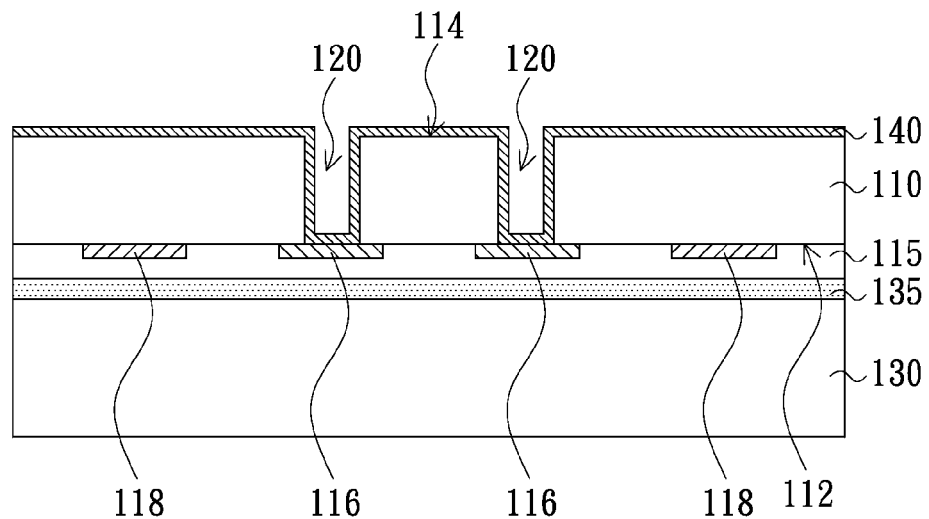

Referring to FIG. 1D, a conductive layer 140 is formed on the back surface 114 of the semiconductor substrate 110 and filled into the through silicon vias 120 to electrically connect to the grounding pads 116. During the follow-up process, the grounding pads 116 are electrically connected to the external grounding device (not shown) through the conductive layer 140. It should be noted that the conductive layer 140 is immediately filled into the through silicon vias 120 and there is not any insulating material formed between the conductive layer 140 and the semiconductor substrate 110. That is, all grounding pads 116 disposed on the active surface 112 can electrically connect to each other through the conductive layer 140 and the semiconductor substrate 110, so the grounding pads 116 has uniform grounding electricity. Therefore, the aforementioned process is suitable to be used for manufacturing semiconductor device with high frequency or high power.

Figure 3:
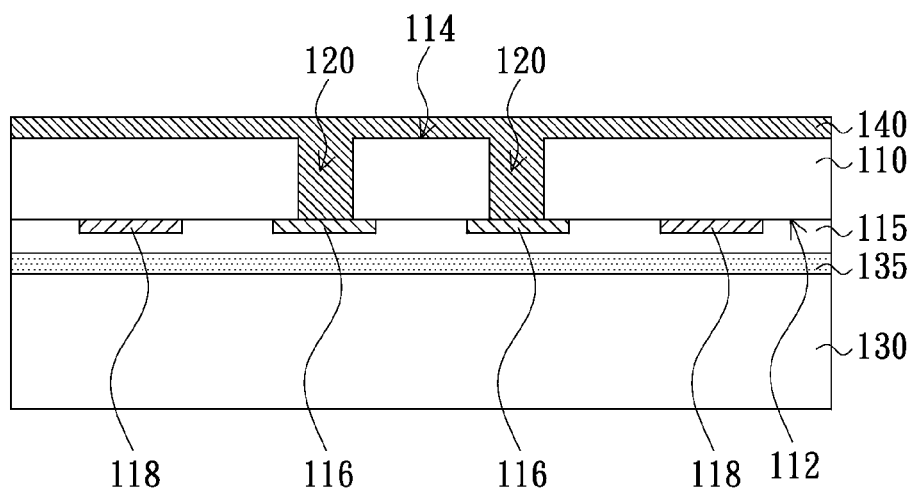
FIG. 3 is a cross-sectional schematic view of a part of a manufacturing process of a semiconductor structure according to another embodiment of the present invention.

In this embodiment, the material of the conductive layer 140 may be copper or aluminum, but the invention is not limited hereto. Moreover, although the conductive layer 140 of this embodiment is conformally filled into the through silicon vias 120, the conductive layer 140 also may be filled the through silicon vias 120 to the full in other embodiments, as shown in FIG. 3, but the invention is not limited hereto.

Figure 1E:
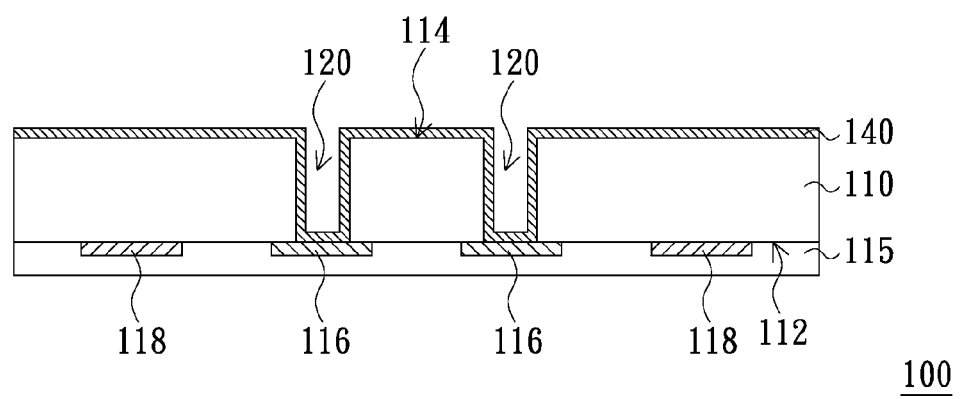

Referring to FIG. 1E, the carrier substrate 130 is separated from the semiconductor substrate 110 after forming the conductive layer 140. A semiconductor structure 100 is substantially made. The method for separating the semiconductor substrate 110 from the carrier substrate 110 is according to the material of the adhering layer 135. For example, the method can be irradiating the adhering layer 135 by ultraviolet light, hot melting the adhering layer 135, mechanical stripping the adhering layer 135 or dissolving the adhering layer 135 by a solvent. After that, the semiconductor structure 100 also can be cut or packaged by well-known process.

Furthermore, if the semiconductor substrate 110 is a chip diced from a wafer, a wire bonding process is performed on the active surface 112 to electrically connect the power supply/signal pads 118 to an external circuit (not shown) after separating the semiconductor substrate 110 from the carrier substrate 130.

In summary, in the present invention, at least one through silicon via is formed on the semiconductor substrate and exposing the grounding pad. Then, a conductive layer is formed on the back surface of the semiconductor substrate and filled into the through silicon via to electrically connect to the grounding pad. In other words, the present invention uses TSV (Through-Silicon Via) technology to fabricate the transmission path of ground signal. Compared to the conventional wire bonding art, the present invention increases the transmission density of ground signal per unit area.

Moreover, since there is not any insulating material formed between the conductive layer and the semiconductor substrate, the grounding pads disposed on the semiconductor substrate can uniformly transmit grounding signals to external grounding device through the conductive layer. Therefore, the operation efficiency of the semiconductor structure of the invention may be improved.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method for manufacturing semiconductor structure, the method comprising:
   forming a via from a first surface of a semiconductor substrate to a ground pad on a second surface of the semiconductor substrate; and
   forming a conductive layer on the first surface of the semiconductor substrate and within the via to form an electrical connection with the ground pad;
   wherein, after said forming a conductive layer, there is no electrically-insulative layer between the conductive layer and the semiconductor substrate.

2. The method of claim 1, further comprising adhering the second surface of the semiconductor substrate to a carrier substrate before said forming a via.

3. The method of claim 2, further comprising separating the semiconductor substrate from the carrier substrate after said forming a conductive layer.

4. The method of claim 3, wherein the semiconductor substrate further comprises a power supply/signal pad disposed on the second surface, and wherein the method further comprises performing a wire bonding process to electrically connect the power supply/signal pad to an external circuit after said separating the semiconductor substrate from the carrier substrate.

5. A semiconductor structure comprising:
a semiconductor substrate including:
a first surface;
a second surface opposite the first surface;
a ground pad disposed on the second surface; and
a via formed through the semiconductor substrate from the first surface to the second surface and exposing the ground pad; and
a conductive layer disposed on the first surface of the semiconductor substrate and within the via, wherein the conductive layer is electrically connected to the ground pad;
wherein no electrically-insulative layer is disposed between the conductive layer and the semiconductor substrate.

6. The semiconductor structure of claim 5, wherein the semiconductor substrate further comprises a power supply/signal pad disposed on the second surface.

7. The semiconductor structure of claim 6, wherein the power supply/signal pad is disposed closer to an edge of the semiconductor substrate than the ground pad is disposed to the edge of the semiconductor substrate.

8. The semiconductor structure of claim 5, wherein the conductive layer comprises copper or aluminum.

9. The semiconductor structure of claim 5, further comprising an adhering layer formed between the carrier substrate and the semiconductor substrate.

10. The semiconductor structure of claim 5, wherein the conductive layer completely fills the via.

11. The semiconductor structure of claim 5, wherein the conductive layer only partially fills the via.

12. The method of claim 1, further comprising forming the ground pad on the second surface of the semiconductor substrate prior to said forming a via.

13. The method of claim 2, wherein said adhering the second surface of the semiconductor substrate to a carrier substrate comprises spreading an adhering layer completely between the carrier substrate and the semiconductor substrate.

14. The method of claim 2, wherein said adhering the second surface of the semiconductor substrate to a carrier substrate comprises patterning an adhering layer between the carrier substrate and the semiconductor substrate.

15. The method of claim 1, wherein said forming a conductive layer comprises electrically connecting the conductive layer to multiple ground pads, and wherein each of the multiple ground pads has a uniform grounding power.

16. The method of claim 1, wherein said forming a conductive layer comprises only partially filling the via with the conductive layer.

17. The method of claim 1, wherein said forming a conductive layer comprises completely filling the via with the conductive layer.

18. The method of claim 1, further comprising connecting the ground pad to an external ground device.

* * * * *